United States Patent
Hsu et al.

(10) Patent No.: US 7,834,559 B2
(45) Date of Patent: Nov. 16, 2010

(54) LAMP CIRCUIT OF LIQUID CRYSTAL DEVICE BACKLIGHT SOURCE

(75) Inventors: Cheng-Chia Hsu, Chupei (TW); Yu-Cheng Pan, Dajhuang Village (TW)

(73) Assignee: Logah Technology Corp., Hsinchu County (TW)

( * ) Notice: Subject to any disclaimer, the term of this patent is extended or adjusted under 35 U.S.C. 154(b) by 521 days.

(21) Appl. No.: 11/354,838

(22) Filed: Feb. 16, 2006

(65) Prior Publication Data

US 2007/0190890 A1    Aug. 16, 2007

(51) Int. Cl.
*H05B 41/16* (2006.01)

(52) U.S. Cl. .................. 315/277; 315/282; 315/312

(58) Field of Classification Search .............. 315/161, 315/169.3, 312, 246–247, 276, 291, 277, 315/282; 345/47–50, 76–77, 87, 102
See application file for complete search history.

(56) References Cited

U.S. PATENT DOCUMENTS

| | | | |
|---|---|---|---|
| 7,411,357 B2* | 8/2008 | Lee | 315/277 |
| 2005/0007333 A1* | 1/2005 | Han et al. | 345/102 |
| 2005/0078080 A1* | 4/2005 | Kang et al. | 345/102 |
| 2005/0134199 A1* | 6/2005 | Suzuki et al. | 315/291 |
| 2005/0253537 A1* | 11/2005 | Jang et al. | 315/307 |
| 2005/0269976 A1* | 12/2005 | Chou et al. | 315/312 |
| 2006/0001385 A1* | 1/2006 | Lee | 315/291 |
| 2006/0023471 A1* | 2/2006 | Ahn et al. | 362/613 |
| 2006/0043910 A1* | 3/2006 | Chan et al. | 315/291 |
| 2006/0061305 A1* | 3/2006 | Ahn et al. | 315/312 |
| 2006/0139013 A1* | 6/2006 | Yoo et al. | 323/201 |
| 2006/0220593 A1* | 10/2006 | Ball | 315/282 |
| 2006/0238987 A1* | 10/2006 | Park et al. | 361/748 |
| 2006/0279232 A1* | 12/2006 | Takahama et al. | 315/282 |

* cited by examiner

*Primary Examiner*—Douglas W Owens
*Assistant Examiner*—Tung X Le
(74) *Attorney, Agent, or Firm*—Chun-Ming Shih

(57) ABSTRACT

Disclosed is an improved lamp circuit of a liquid crystal device (LCD) backlight source, comprising a printed circuit board (PCB) for lamp initialization having a control circuit and a first connector thereon; a first lamp connection board disposed between the first lamp connection board and a second lamp connection board and being lamps of the LCD backlight source; a second lamp connection board having a second connector and transformers thereon, the transformers each corresponding to one of the lamps; and a low voltage wire set connected between the first connector on the PCB for lamp initialization and the second connector on the second lamp connection board, wherein a signal issued from the first connector on the PCB for lamp initialization is transmitted through the low voltage wire set to the second connector on the first PCB for lamp initialization and then to a corresponding one of the transformers so that the lamps may be driven to operate. With use of the present invention, number of the used connectors may be reduced and arrangement issue of the high voltage wires may be obviated, making volume of the PCB for lamp initialization allowed to be reduced and cost of the lamp circuit lowered.

3 Claims, 3 Drawing Sheets

LAMP CIRCUIT OF LIQUID CRYSTAL DEVICE BACKLIGHT SOURCE

BACKGROUND OF THE INVENTION

1. Field of the Invention

The present invention relates to an improved lamp circuit of a liquid crystal device (LCD) backlight source, particularly to a lamp circuit of a LCD backlight source.

2. Description of the Prior Art

Referring to FIGS. 1A and 1B, a top view and a side view of a conventional lamp circuit of liquid crystal device (LCD) are respectively shown therein. As shown, in the conventional lamp circuit of LCD backlight source 1, a printed circuit board (PCB) for lamp initialization 11 has a control circuit 111 thereon, lamps 12 each have a respective transformer 112, connectors 113 each correspond to two of the transformers 112, high voltage wires 13 each output a signal from the respective transformer 112 through the corresponding connector 113 to the corresponding lamp 12 connected between a first lamp connection board 14 and a second lamp connection lamp board 15. As such, the lamps 12 may be driven to operate according to the control signal issued by the control circuit 11. Although the lamps 12 may be normally driven, some shortcomings are unavoidably inherent in such lamp arrangement of LCD backlight source, which are recited as follows: 1. Each two transformers requires a respective connector, which leads to a high manufacturing cost. 2. An increased lamp amount requires a corresponding increase of the transformers, resulting in a larger volume of the PCB for lamp initialization and thus a difficult arrangement and an increased cost. 3. Since several high voltage wires are required to be connected to the lamps from the corresponding connector, the lamps are vulnerable since the high voltage wires are generally knotted or wound disorderedly.

Therefore, there is still some problems to be addressed with respect to the prior lamp circuit of LCD backlight source. In view of these problems, the Inventors have paid an effort in the related research and finally developed successfully an inventive lamp circuit of LCD backlight source.

SUMMARY OF THE INVENTION

It is, therefore, an object of the present invention to provide an improved lamp circuit of liquid crystal device (LCD) backlight source having connectors and high voltage wires whose number may be reduced and cost therefore may be thus lowered.

It is another object of the present invention to provide a LCD backlight source having a printed circuit board (PCB) for lamp initialization whose volume may be reduced, leading to a decreased cost and easy installation.

It is yet another object of the present invention to provide an improved lamp circuit of liquid crystal device (LCD) backlight source providing the advantages of enhanced stability, prolonged lifetime, reduced cost and saved arrangement space.

In accordance with the present invention, the improved lamp circuit of LCD backlight source comprises a printed circuit board (PCB) for lamp initialization having a control circuit and a first connector thereon; a first lamp connection board disposed between the first lamp connection board and a second lamp connection board and being lamps of the LCD backlight source; a second lamp connection board having a second connector and transformers thereon, the transformers each corresponding to one of the lamps; and a low voltage wire set connected between the first connector on the PCB for lamp initialization and the second connector on the second lamp connection board, wherein a signal issued from the first connector on the PCB for lamp initialization is transmitted through the low voltage wire set to the second connector on the first PCB for lamp initialization and then to a corresponding one of the transformers so that the lamps may be driven to operate.

With use of the present invention, number of the used connectors may be reduced and arrangement issue of the high voltage wires may be obviated, making volume of the PCB for lamp initialization allowed to be reduced and cost of the lamp circuit lowered.

BRIEF DESCRIPTION OF THE DRAWINGS

The drawings disclose illustrative embodiments of the present invention which serve to exemplify the various advantages and objects hereof, and are as follows.

DETAILED DESCRIPTION OF THE PREFERRED EMBODIMENT

Figure 1A:
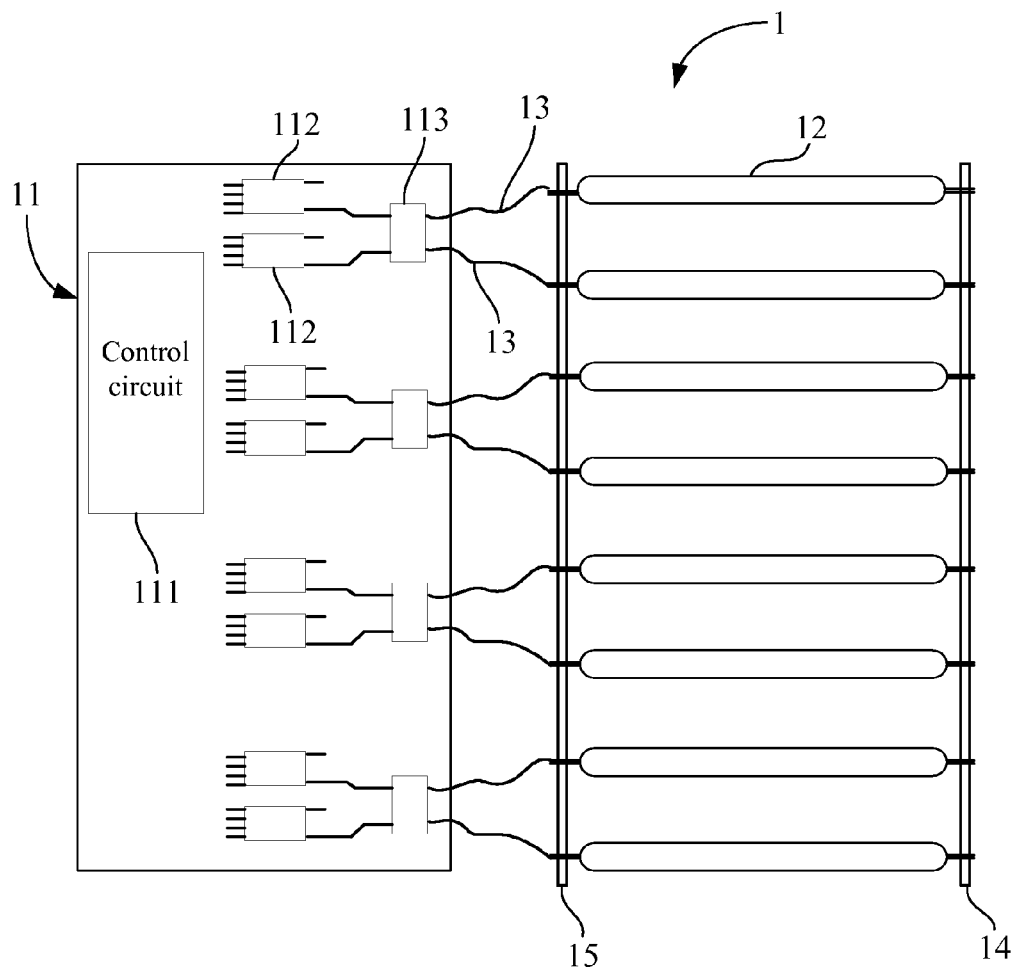
FIG. 1A is a top view of a conventional lamp circuit of liquid crystal device (LCD)
Figure 1B:
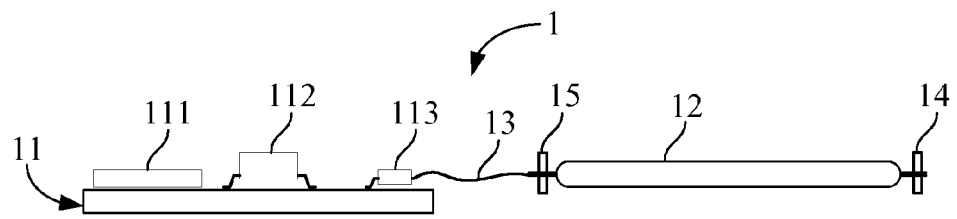
FIG. 1B is a side view of the conventional lamp circuit of LCD.
Figure 2A:
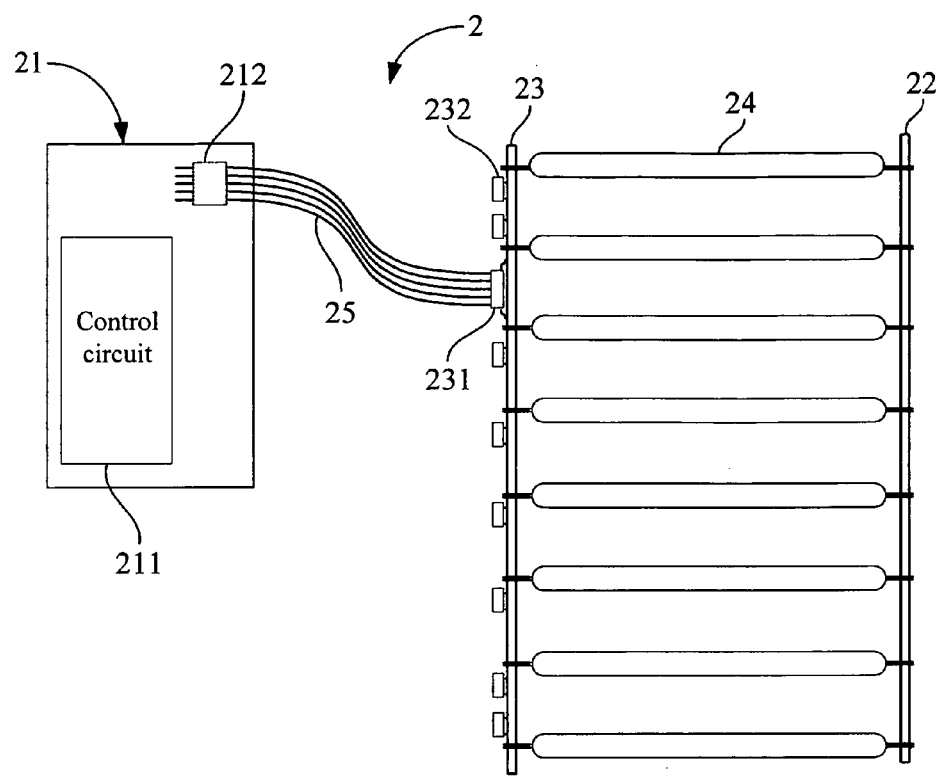
FIG. 2A is a top view of an improved lamp circuit of LCD backlight source according to a first embodiment of the present invention.
Figure 2B:
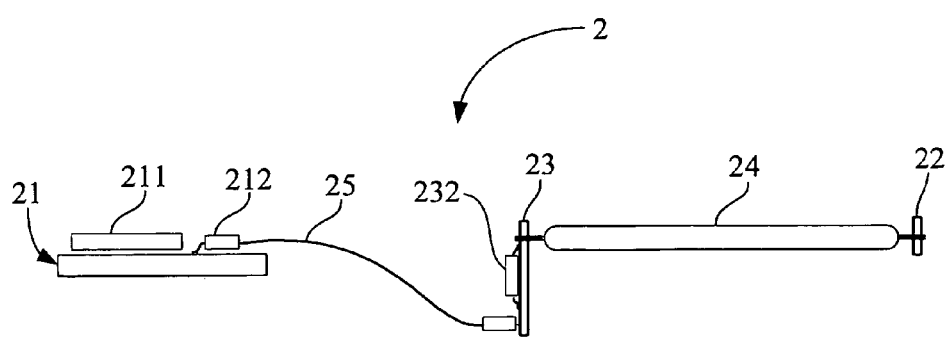
FIG. 2B is a side view of the improved lamp circuit of LCD backlight source according to the first embodiment of the present invention.

Referring to FIGS. 2A and 2B, a top view and a side view of an improved lamp circuit of liquid crystal device (LCD) backlight source according to a first embodiment of the present invention are shown therein. As shown, the improved lamp circuit 2 comprises a printed circuit board (PCB) for lamp initialization 21, a first lamp connection board 22, a second lamp connection board 23 and a low voltage wire set 25.

The PCB for lamp initialization 21 has a control circuit 211 and a first connector 212. The control lines 211 may be an integrated circuit for pulse width modulation (PWMIC) or a microprocessor.

The first lamp connection board 22 is connected between the first and second lamp connection boards 22, 23 and is lamps 24 of the LCD backlight source. Alternatively, the first lamp connection board 22 may be replaced with connection wires.

The second lamp connection board 23 has a second connector 231 and transformers 232 thereon, the transformers 232 each corresponding to one of the lamps 24.

The low voltage wire set 25 is connected between the first connector 212 on the PCB for lamp initialization 21 and the second connector 231 on the second lamp connection board 23.

With the above components and arrangement, the control circuit of the PCB for lamp initialization 21 issues one or more control signal and the control signal is transmitted to the second connector 231 on the first lamp connection board 22 through the low voltage wire set 25. Then, each of the control signals is outputted to the respective transformer 232 from the second connector 231 so as to drive the lamps 24 to operate.

Figure 3A:
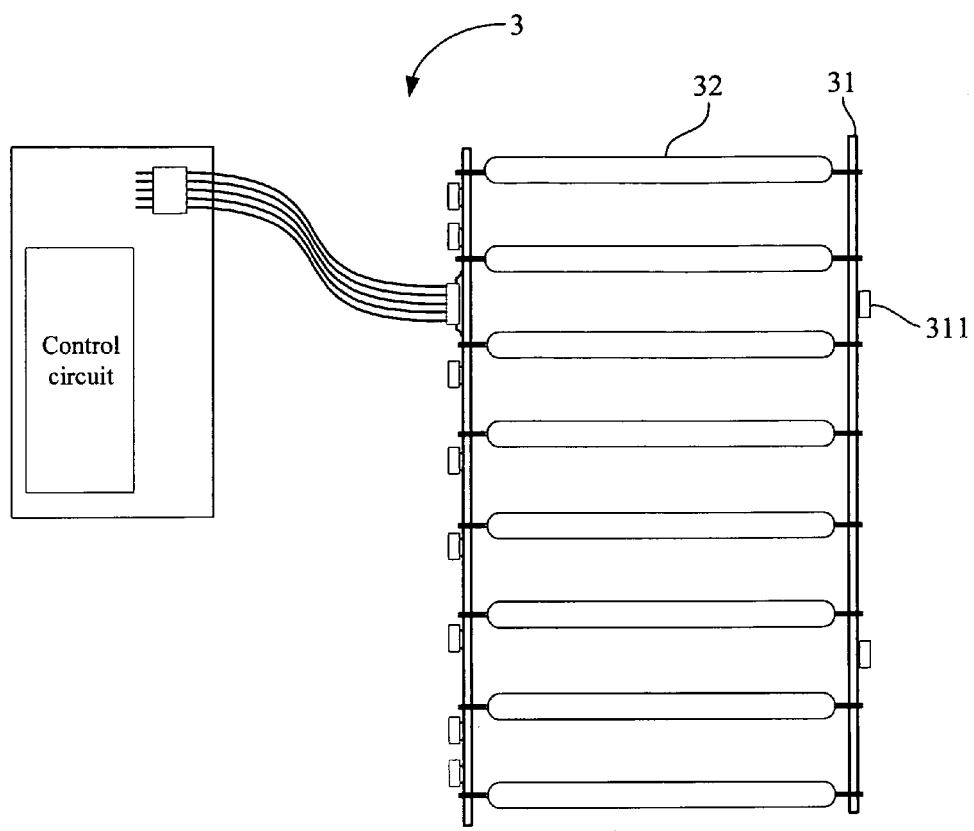
FIG. 3A is a top view of the improved lamp circuit of LCD backlight source according to a second embodiment of the present invention.
Figure 3B:
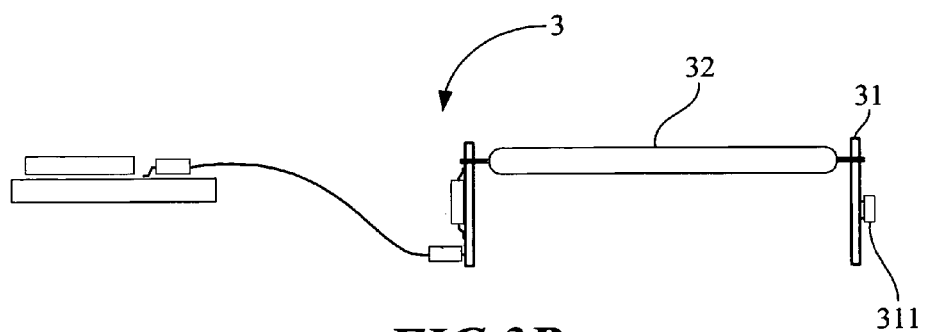
FIG. 3B is a side view of the improved lamp circuit of LCD backlight source according to the second embodiment of the present invention.

Referring to FIGS. 3A and 3B, a top view and a side view of an improved lamp circuit of LCD backlight source according to a second embodiment of the present invention are shown therein. As shown, this embodiment is identical to the first embodiment except that at least an inverter 311 may be disposed on the first lamp connection board 31 so that a current flown through each of the lamps 32 may be effectively balanced.

As compared to the prior art, the improved lamp circuit of LCD backlight source provides the following advantages: 1. Number of the connector and high voltage wires may be reduced to lower cost of the lamp circuit. 2. Volume of the PCB for control of the lamps may be reduced to lower cost of the lamp circuit and thus the PCB is easy to be installed. 3. The lamp circuit has promoted stability, prolonged lifetime, reduced cost and saved arrangement space.

Many changes and modifications in the above described embodiments of the invention can, of course, be carried out without departing from the scope thereof. Accordingly, the disclosed embodiments are not intended to be deemed in a limiting sense and the scope of the invention should be construed only by the scope of the appended claims.

What is claimed is:

1. A lamp circuit of a liquid crystal device (LCD) backlight source, comprising:
    an unique pair of connectors including a first connector and a second connector;
    a printed circuit board (PCB) for lamp initialization, having a control circuit and the first connector formed thereon;
    a first lamp connection board having at least one inverter formed thereon;
    a second lamp connection board formed separately from the first lamp connection board, having the second connector and a plurality of transformers formed thereon;
    a plurality of lamps connected between the first and the second lamp connection boards, a number of the lamps being the same as that of the transformers so that each lamp is correspondingly connected to one of the transformer; and
    a low voltage wire set connected between the first connector and the second connector,
    wherein a signal transmitted from the first connector is transmitted through the low voltage wire set to the second connector and then to the transformers so that the lamps are driven to operate, and since the inverter is disposed on the first lamp connection board so that a current flown through each of the lamps is effectively balanced.

2. The lamp circuit according to claim 1, wherein the control circuit is a pulse width modulation (PWM) device.

3. The lamp circuit according to claim 1, wherein the control circuit is a microprocessor.

* * * * *